United States Patent
Acker

(10) Patent No.: US 9,551,727 B2
(45) Date of Patent: Jan. 24, 2017

(54) DEVICE FOR MEASURING THE ANGULAR VELOCITY OR VELOCITY OF A MOVING PART AND FOR DETECTING THE DIRECTION OF MOTION OF THE MOVING PART

(75) Inventor: Heinrich Acker, Schwalbach (DE)

(73) Assignee: Continental Teves AG & Co. oHG, Frankfurt (DE)

( * ) Notice: Subject to any disclaimer, the term of this patent is extended or adjusted under 35 U.S.C. 154(b) by 389 days.

(21) Appl. No.: 14/131,960

(22) PCT Filed: Jul. 10, 2012

(86) PCT No.: PCT/EP2012/063517
§ 371 (c)(1),
(2), (4) Date: Feb. 11, 2014

(87) PCT Pub. No.: WO2013/007730
PCT Pub. Date: Jan. 17, 2013

(65) Prior Publication Data
US 2014/0150551 A1  Jun. 5, 2014

(30) Foreign Application Priority Data
Jul. 11, 2011  (DE) .................... 10 2011 078 977

(51) Int. Cl.
*G01P 3/48* (2006.01)
*G01D 5/245* (2006.01)
(Continued)

(52) U.S. Cl.
CPC .............. *G01P 3/48* (2013.01); *G01D 5/2451* (2013.01); *G01P 3/36* (2013.01); *G01P 3/481* (2013.01);
(Continued)

(58) Field of Classification Search
CPC ....... G01D 5/2451; G01D 5/2454; G01P 3/48; G01P 3/36; G01P 3/481; G01P 3/489; G01P 13/045; G01P 13/04; H03M 1/305
(Continued)

(56) References Cited

U.S. PATENT DOCUMENTS 4,050,747 A * 9/1977 Ruhnau .................... G01P 3/489
303/195
4,142,153 A * 2/1979 Smith .................... G01P 13/045
324/165
(Continued)

FOREIGN PATENT DOCUMENTS

CN  1413302  4/2003
CN  1618008  5/2005
(Continued)

OTHER PUBLICATIONS

International Search Report for PCT/EP2012/063517 dated Jan. 23, 2013.
(Continued)

*Primary Examiner* — Paul West
*Assistant Examiner* — Xin Zhong
(74) *Attorney, Agent, or Firm* — RatnerPrestia

(57) ABSTRACT

Motion detection device consisting of a single encoder and a single stationary sensor element, the encoder, which is arranged on a movable part, representing an asymmetrical pattern. The angular velocity or velocity and the direction of motion of a moving part are determined from the sensor signal by measuring the edge steepness or the rise time or fall time, spectrally analyzing the frequency and the phase relation of a harmonic to the phase of the fundamental mode, or evaluating the asymmetries of a sequence of rectangular pulses.

9 Claims, 4 Drawing Sheets

(51) Int. Cl.
    *G01P 3/481*     (2006.01)
    *G01P 3/489*     (2006.01)
    *G01P 13/04*     (2006.01)
    *H03M 1/30*     (2006.01)
    *G01P 3/36*     (2006.01)

(52) U.S. Cl.
    CPC ............ *G01P 3/489* (2013.01); *G01P 13/04* (2013.01); *G01P 13/045* (2013.01); *H03M 1/305* (2013.01)

(58) Field of Classification Search
    USPC ................. 73/488, 504.01, 504.39; 324/165
    See application file for complete search history.

(56) References Cited

U.S. PATENT DOCUMENTS

| | | | | |
|---|---|---|---|---|
| 5,371,460 | A | * | 12/1994 | Coffman ............... G01P 13/045 324/165 |
| 5,977,765 | A | * | 11/1999 | Gibson ............... F02D 41/0097 324/165 |
| 6,727,686 | B2 | | 4/2004 | Beckmann |
| 7,089,672 | B2 | | 8/2006 | Noltemeyer |
| 2002/0180426 | A1 | * | 12/2002 | Schroeder .............. G01B 7/315 324/207.22 |
| 2010/0181993 | A1 | * | 7/2010 | Fernandez ............... G01B 7/30 324/207.2 |

FOREIGN PATENT DOCUMENTS

| | | |
|---|---|---|
| CN | 101275969 | 10/2008 |
| DE | 32 47 174 A1 | 6/1984 |
| DE | 44 28 396 A1 | 2/1996 |
| DE | 198 51 942 A1 | 6/1999 |
| DE | 198 14 758 A1 | 10/1999 |
| DE | 101 33 381 A1 | 1/2003 |
| EP | 1 324 050 A2 | 7/2003 |

OTHER PUBLICATIONS

Written Opinion of International Searching Authority for PCT/EP2012/063517 dated Jan. 23, 2013.
German Search Report for 10 2011 078 977.4 dated Dec. 29, 2011.
Chinese Office Action mailed Dec. 17, 2014 in Chinese Application No. 201280043840.5.

* cited by examiner

Direction Of Motion

Direction Of Motion

Direction Of Motion

DEVICE FOR MEASURING THE ANGULAR VELOCITY OR VELOCITY OF A MOVING PART AND FOR DETECTING THE DIRECTION OF MOTION OF THE MOVING PART

CROSS REFERENCE TO RELATED APPLICATIONS

This application is the U.S. National Phase Application of PCT/EP2012/063517, filed Jul. 10, 2012, which claims priority to German Patent Application No. 10 2011 078 977.4, filed Jul. 11, 2011, the contents of such applications being incorporated by reference herein.

FIELD OF THE INVENTION

The present invention relates to a device for measuring the angular speed or speed of a moving part and for detecting the direction of motion of the same with a sensor that is or can be disposed in a stationary state and an encoder that can be or is disposed on the moving part and that together with the sensor generates a signal that follows the encoder form, wherein the encoder has a structure that reproduces a periodic pattern for the frequency measurement that is necessary for the angular speed/speed measurement.

BACKGROUND OF THE INVENTION

The measurement of a revolution rate, which is required in the technology on many machines and plants, is physically equivalent to the measurement of the angular speed. It is generally known to measure the revolution rate of shafts by applying a periodic pattern to the circumference of the shaft, the pattern being known as an "encoder", e.g. a toothed wheel, which is sensed by a sensor fixedly disposed adjacent to the shaft. The sensor is able to differentiate between a tooth and a tooth gap or other periodically changing properties, such as e.g. a magnetic field direction or an optical transparency. The sensor subsequently generates an output signal having the same periodicity as the sensed pattern.

Such a sensor outputs different signals depending on the available signal processing. These may be approximately sinusoidal signals that are mainly generated directly by the primary sensor element of the sensor, or square wave signals that are mainly generated by the downstream signal processing by means of comparators.

If in addition a direction detection of the motion observed by the sensor is necessary, the use is known of a separate additional system comprising another encoder and sensor element, which is shifted by a quarter of the periodic length of the pattern for the same structure. The direction detection is based on the phase shift of the signals between the two systems, which is always a quarter of the periodic length in magnitude but which changes between leading and trailing depending on the direction.

Alternatively, a direction-sensitive phase shift between two signals can be generated by two sensor elements that interact with the same encoder but that have a separation in the direction of motion that causes a suitable phase shift. This design is advantageous because of saving the second encoder. In particular, with a small separation of the two sensor elements it is additionally advantageous that the elements can be integrated, e.g. within a common housing and in the case of semiconductor elements may even be monolithically integrated.

The technique presented is used in the same way for the speed measurement of linear motions, wherein linear instead of ring encoders are used.

The term "sensor" used here includes the actual sensor element, which together with the encoder generates the signal, and the associated signal processing/evaluation unit.

A device of the type described above, which comprises a sensor with two sensor elements, is known. Such a device thus comprises an additional system that consists of a second sensor element and the associated signal path (amplifier, filter etc.). Said additional system leads to associated costs. Also the selection of a fixed separation of the sensor elements is disadvantageous because the use of encoders with different periodic lengths is restricted. Indeed it is not necessary for the phase shift to be a quarter of the periodic length of the pattern, but said phase shift results in the highest signal magnitude with regard to the determination of the directions of motion. In the case of small values the requirements on the measurements of the phase shift are increased. However, providing an adapted separation of the sensor elements for each encoder or each application acts a cost driver as a result of the small numbers of items for each of said systems. In particular, the monolithic integration of semiconductor elements, such as e.g. Hall generators, is changed from a cost advantage to a disadvantage in the case of small numbers of items as a result of application-dependent design of the relevant system.

SUMMARY OF THE INVENTION

An aspect of the present invention is to provide a simply designed and inexpensive device of the type represented above.

This aspect is achieved by a device of the stated type according to the invention in that the sensor comprises a single sensor element for frequency measurement and detecting the direction of motion and that the periodic pattern of the encoder is of asymmetric form.

According to an aspect of the invention, a sensor with a single sensor element is employed that is used both for angular speed/speed measurement (frequency measurement) and also for detecting the direction of motion. The periodic pattern of the encoder is of asymmetric form, so that the signal of the sensor element, i.e. the physical transducer, is also asymmetrical. The signal period then consists of a first approximation of two edges with a different sign of the gradient and a different duration or steepness. The sign of the gradient of the two signal edges, which can be distinguished because of the magnitude of the gradient, is different depending on the direction of motion. The analysis of said signal can be carried out by measurement of the gradient or edge duration in the event of a high signal-to-noise ratio. For a high level of noise immunity, however, a spectral analysis is preferred.

The spectral direction detection is based on the observation that with an inversion of the time profile of a function (synonymous with the reversal of the direction of motion) no change occurs to the amplitude spectrum, but the phase spectrum changes if the image of the inverted function is different from the image of the original function. In the case of only two edges per period this condition is synonymous with different edge gradients or durations as well as with asymmetry. With suitable selection of the function with which the encoder modulates the output signal of the sensor element, the analysis of the phase of a single harmonic in relation to the phase of the fundamental oscillation is sufficient for distinguishing the directions of motion.

Preferably, the sensor thus comprises an evaluation unit for performing a spectral signal analysis, wherein the evaluation unit is especially designed for analysis of the phase of a very low order harmonic of the signal frequency.

As mentioned, the sensor and encoder are preferably designed such that a signal profile with steep and shallow edge sections is generated. An embodiment is particularly preferred here with which an approximately saw tooth signal profile is generated.

The circuit parts of the sensor of the device designed according to the invention, especially those with which the phase of certain spectral components can be measured, are not specifically dealt with here. Said circuit parts can be of a known type. In one special embodiment of the invention it is assumed therefrom that the sensor carries out the following steps for direction detection using known circuit concepts (analogue, digital or mixed) and comprises corresponding circuit parts:

1. Measurement or isolation of the frequency of the fundamental oscillation from the frequency mixture of the input signal.
2. Multiplying, preferably doubling, the fundamental oscillation to the frequency of the selected harmonic for the direction detection, thereby obtaining a fixed but optionally selectable phase relationship between the fundamental oscillation and the generated oscillation.
3. Determining the phase shift between the oscillation generated in step (2) and the selected harmonic.
4. Deciding on a direction of motion based on the phase shift.
5. Outputting the direction of motion in an optional code via an optional interface of the sensor system to the receiver of the measured information.

By this process the direction detection function is encoded in the encoder form. The use of a second sensor element with a connected signal path is superfluous. Furthermore, the measured phase shift does not depend on the period length of the encoder pattern and the signal amplitude is thus optimal for very different period lengths.

Preferably, the shape of the profile of the modulating effect of the respective encoder is optimized in connection with the characteristic curve of the selected sensor element. The asymmetry of the encoder is especially implemented according to the invention so that a very marked asymmetry of the signal is achieved at the output of the sensor element. The exact signal profile is influenced by the sensor element technology used. With optical sensors an almost ideal saw tooth profile is possible. With magnetic sensors, the gradient of the steeper edge is limited depending on the working distance. In particular, the aim according to the invention is as close an approximation to the saw tooth profile as possible, because the relative amplitude of the first harmonic (for a doubled frequency), which is preferably to be analyzed, is then particularly high.

In a development of the device designed according to the invention, the periodic pattern is a series of successive periods of the encoder pattern, wherein each pattern of the series is of asymmetrical form. Said embodiment has certain advantages. The previously described procedure requires a certain circuit complexity, which can be avoided if a simpler but less powerful version of the analysis of different gradients is selected. For this purpose, a series of successive periods of the encoder pattern are suitably modified so that the amplitude, length or phase angle is different. As a result the pattern is now no longer periodic with the original period, but with the length of the entire series. If the pattern of the series thereby has asymmetry, a similar process can be used with the series as with an asymmetric encoder form, but without the need for spectral analysis. The disadvantage is the lower positional resolution, because instead of a period of the encoder form the entire series must now be run through in order to obtain sufficient data to decide on a direction.

Preferably, the series consists of identical symmetrical patterns, which only differ from each other in one property, wherein especially one property of the pattern of the series has three different values (property=amplitude, frequency or phase angle).

Because it offers no general advantages to use more than three periods, on the other hand at least one series of three periods of the unmodified pattern is necessary in order to generate the necessary asymmetry for direction detection by modification and also to limit the adjacent series, the use of exactly three periods is preferred.

Furthermore, an aspect of the invention relates to a device that is characterized in that the encoder and sensor are additionally designed for angle or travel measurement.

The device according to the invention can also be used without limitation for the measurement of linear motions. For this purpose only a linear encoder instead of a ring encoder is necessary. Besides general applications on any rotating shafts or linear moving machine parts or vehicle parts, the device is particularly suitable for the following applications:

1. Measurement on wheels of vehicles (wheel revolution rate sensors)
2. Measurement on crankshafts of internal combustion engines. Here the direction of rotation detection is especially used to determine the standstill angle when switching off the machine. Indeed most internal combustion engines only detect one active direction of rotation, but a temporary movement in the opposite direction can occur shortly before standstill while running down. The measurement of the standstill angle enables a faster start when restarting and is therefore relevant to start-stop systems among other things.
3. Measurement on drive train components of motor vehicles, e.g. in gearboxes.

BRIEF DESCRIPTION OF THE DRAWINGS

The invention is explained in detail below using exemplary embodiments in connection with the figures. In the figures.

DETAILED DESCRIPTION OF THE INVENTION

All exemplary embodiments show possible implementations of the present invention schematically. "Schematically" means here that a specific implementation was abstracted from the properties below, because the corresponding details in the invention did not undergo any change compared to the prior art. As features they can be combined with the solution according to the invention:

1. The measurement coordinates: all encoder forms are shown as linear for reasons of graphic simplicity, but the structure of the encoder along the measurement coordinates applies equally to a ring encoder. The representation then corresponds to a so-called unwinding. The direction of motion is indicated by the arrow.
2. For versions in which a series of periods of the encoder pattern is used for direction detection: the metrological optimization of an encoder also includes the shaping of the transition between the individual parts of the pattern, e.g. between tooth and tooth gap. The selected schematic representation is not concerned with the exact geometry of the pattern, but only contains the representation of tooth and tooth gap as such.
3. The different nature of encoders, i.e. the physical variable that is modulated within the pattern, is not considered. All modulated variables, whether geometric, magnetic, optical or other, are symbolized by way of example by a tooth and tooth gap or by rising and falling edges.

Figure 1:
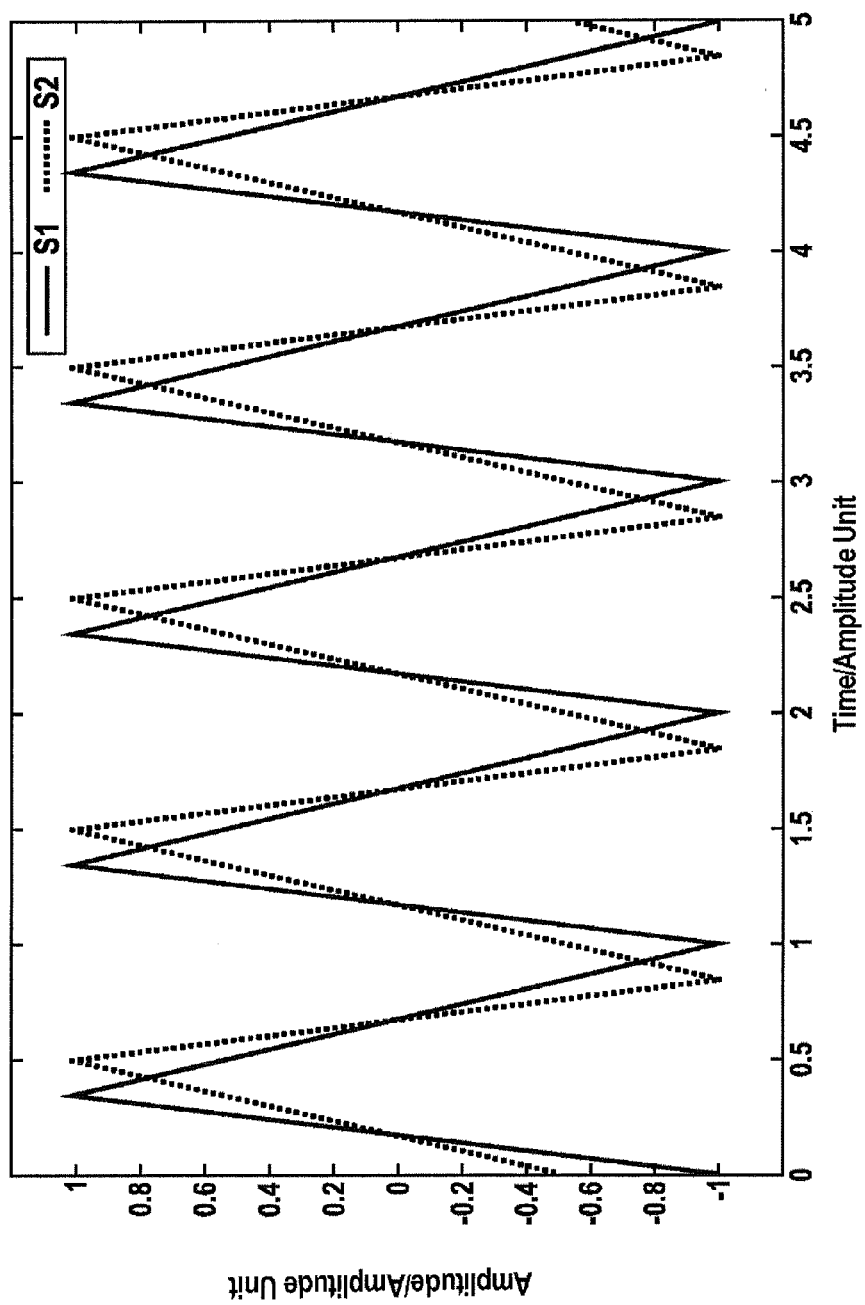
FIG. 1 shows a diagram, in which the profile of two signals S1 and S2 is illustrated.

FIG. 1 shows two signals S1 and S2 that result from the measurement of an encoder in two opposite directions. Therefore, they are different only in the order of the individual components or are mirror images of each other. Each signal S1 and S2 comprises a steep and a shallow edge per period. The period and amplitude are normalized to arbitrary units ("a.u.", "arbitrary unit").

Figure 2A:
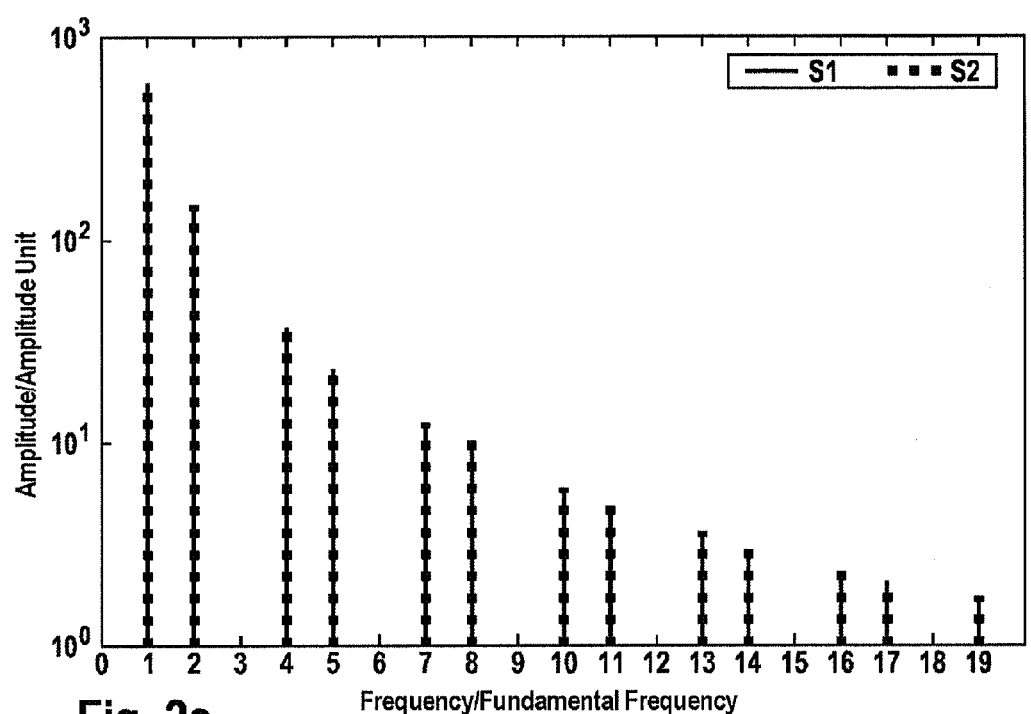
FIG. 2a shows the amplitude spectrum of signals S1 and S2.
Figure 2B:
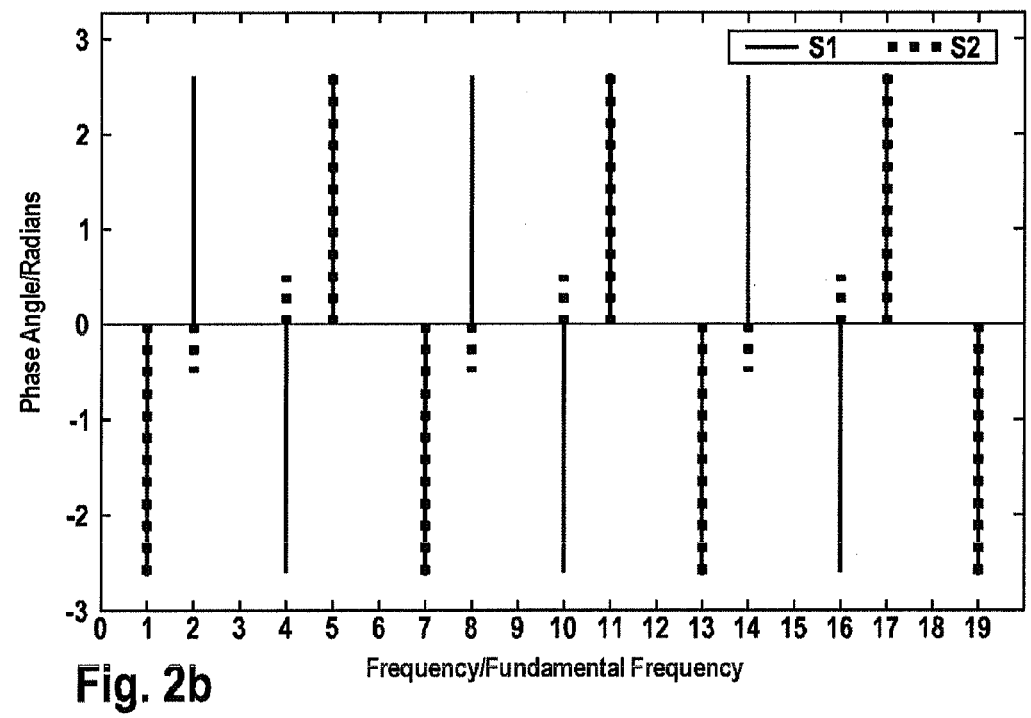
FIG. 2b shows the phase spectrum of signals S1 and S2.

In FIG. 2a the amplitude spectrum and in FIG. 2b the phase spectrum of the signals S1, S2 are illustrated. The lines for the representation of both signals were selected such that exactly coincident spectral components can also be identified. S1 is thin and solid, S2 is thick and dotted. The two disposed one on the other produce a unique pattern—as can be seen for the amplitude spectrum, which is completely identical for both signals. With the phase spectrum by contrast there are significant differences. Whereas the phase of the fundamental oscillation coincides, which was achieved by a corresponding shift of signal S2 (see FIG. 1), the main first harmonic of interest—for the doubled frequency—has a phase shifted by Pi (180°), which is the maximum possible value. The following is to be noted for a better understanding: the shift of the signal S2 only takes place in order to achieve coincidence in the phase of the fundamental oscillation, with which the actual phase shift of interest is more visible. Because only either S1 or S2 is ever measured by the sensor system, there is no metrologically relevant phase relationship between S1 and S2. Rather, the phase shift between the fundamental oscillation and the first harmonic of one of the two signals is decisive for the direction detection. This can be more easily seen if the fundamental oscillations are in phase. In principle, higher order harmonics could also be used for the direction detection, as can be read off from the phase spectrum. However, this is unattractive because the amplitude of this harmonic is significantly smaller, whereby a stable phase measurement in a noisy environment is made unnecessarily difficult.

Figure 3:
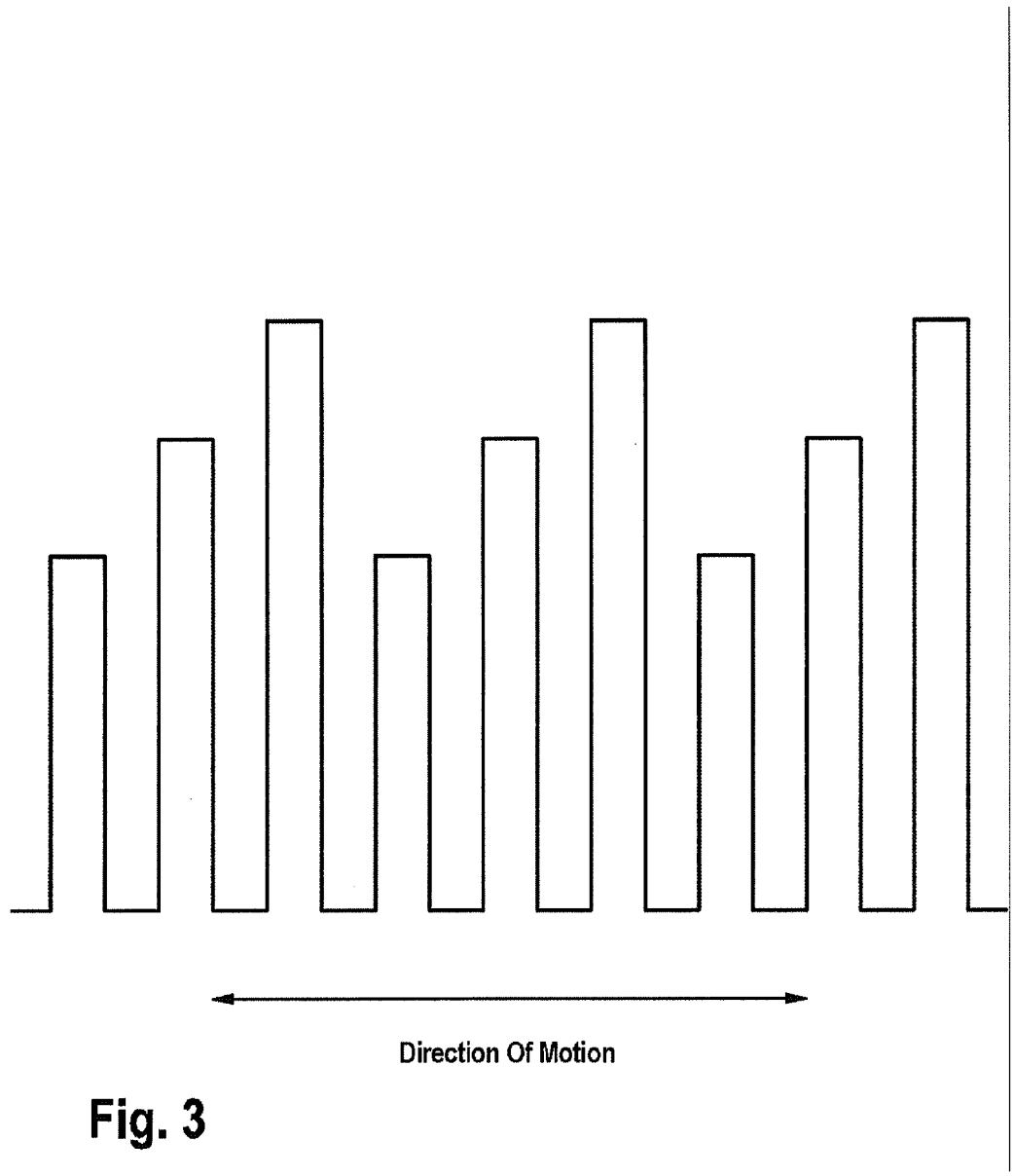
FIG. 3 shows an embodiment of an encoder pattern.

FIG. 3 shows an encoder pattern for the versions of the solution according to the invention without spectral analysis. Each three teeth form a series in which the direction can be determined because the signal amplitude is different.

Figure 4:
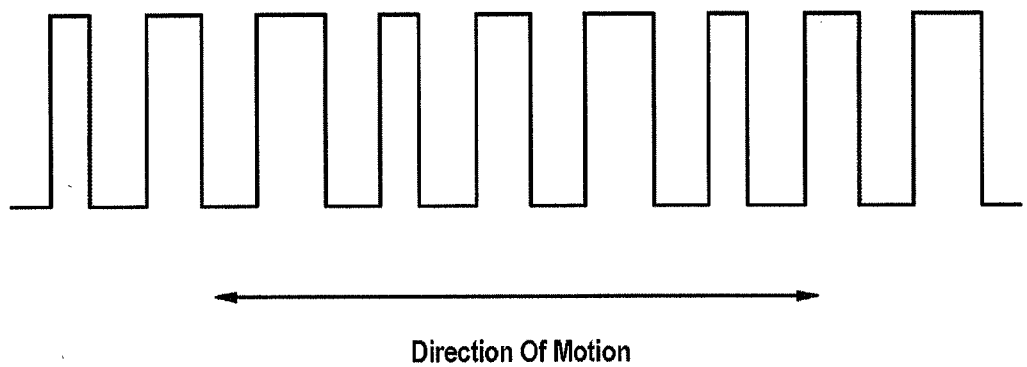
FIG. 4 shows another embodiment of an encoder pattern.

FIG. 4 shows an encoder pattern with the same function as FIG. 3, in which the frequency or length of the components has been changed.

Figure 5:
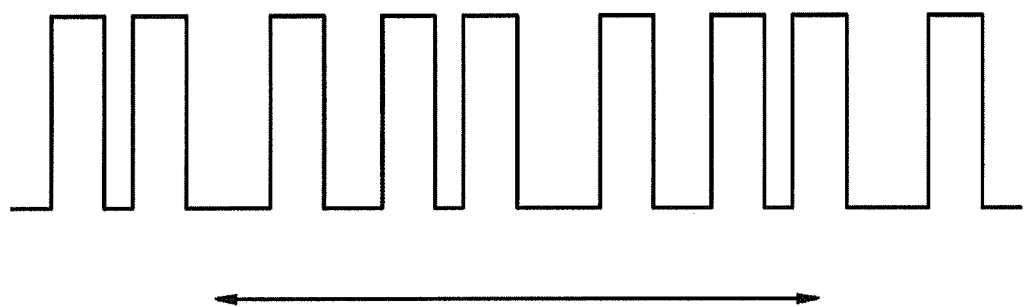
FIG. 5 shows a third embodiment of an encoder pattern.

In FIG. 5 finally the phase angle of the components of the encoder pattern has been changed. In contrast to FIG. 3 and FIG. 4, it is not a series in which a property of the pattern adopts three different values, but a shift of the middle of three teeth alone is sufficient to enable the direction detection (the gaps, which have three different lengths, are used). FIGS. 4 and 5 can be converted into each other by interchanging tooth and gap, so that the difference lies more in the interpretation of the signal than in the encoder form.

The invention claimed is:

1. A device for measuring the angular speed or the speed of a moving part and for detecting the direction of motion thereof with a sensor that can be or is disposed in a stationary manner and an encoder that can be or is disposed on the moving part, which together with the sensor generates a signal that follows the encoder form, wherein the encoder has a structure reproducing a periodic pattern for frequency measurement that is necessary for the angular speed/speed measurement, wherein the sensor comprises a single sensor element for frequency measurement and for detecting the direction of motion and the periodic pattern of the encoder is of asymmetric form, wherein the sensor comprises an evaluation unit configured to perform an analysis of a phase of a harmonic of the signal of a lowest possible order.

2. The device as claimed in claim 1, wherein the sensor comprises an evaluation unit for measuring a gradient or edge duration of the signal generated by the sensor element.

3. The device as claimed in claim 1, wherein the sensor and encoder are designed such that a signal profile with steep and shallow edge sections is generated.

4. The device as claimed in claim 1, wherein the sensor and encoder are designed such that an approximately saw tooth signal profile is generated.

5. The device as claimed in claim 1, wherein the periodic pattern is a series of successive periods of the encoder pattern, wherein each pattern of the series is of asymmetric form.

6. The device as claimed in claim 5, wherein the series comprises identical symmetrical patterns, which only differ from each other in one property.

7. The device as claimed in claim 6, wherein one property of the pattern of the series has three different values.

8. The device as claimed in claim 1, wherein the encoder and sensor are additionally designed for angle or distance measurement.

9. The device as claimed in claim 1, wherein the device comprises only a subsystem of an encoder, a sensor element and a signal path associated therewith.

* * * * *